United States Patent
Iyechika et al.

(10) Patent No.: US 6,472,298 B2
(45) Date of Patent: Oct. 29, 2002

(54) LAYERED GROUP III-V COMPOUND SEMICONDUCTOR, METHOD OF MANUFACTURING THE SAME AND LIGHT EMITTING ELEMENT

(75) Inventors: Yasushi Iyechika; Tomoyuki Takada, both of Tsukuba; Yoshinobu Ono, Ibaraki, all of (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/998,296

(22) Filed: Dec. 3, 2001

(65) Prior Publication Data

US 2002/0053680 A1 May 9, 2002

Related U.S. Application Data (62) Division of application No. 08/590,574, filed on Jan. 24, 1996, now Pat. No. 6,346,720.

(30) Foreign Application Priority Data

| Feb. 3, 1995 | (JP) | 7-016651 |
| Apr. 4, 1995 | (JP) | 7-078671 |
| Jul. 14, 1995 | (JP) | 7-178725 |
| Aug. 11, 1995 | (JP) | 7-205954 |

(51) Int. Cl.[7] ......... H01L 21/20; H01L 21/36; C30B 23/00; C30B 25/00
(52) U.S. Cl. ............. 438/493; 438/46; 117/89; 117/104
(58) Field of Search ......... 438/493, 46; 117/89, 117/104

(56) References Cited

U.S. PATENT DOCUMENTS

| 5,652,438 A | 7/1997 | Sassa et al. |
| 5,740,192 A | * 4/1998 | Hatano et al. ......... 257/101 |
| 5,767,581 A | 6/1998 | Nakamura et al. |
| 5,777,350 A | 7/1998 | Nakamura et al. |

FOREIGN PATENT DOCUMENTS

| JP | 55-3834 | 1/1980 |

(List continued on next page.)

OTHER PUBLICATIONS

Tsang, "Extremely low threshold (AIGa) As modified multiquantum well heterostructure laswers grown by molecular–beam epitaxy," *App. Phys. Lett.*, Nov. 15, 1981, pp. 786–788, vol. 39, No. 10, American Institute of Physics.

(List continued on next page.)

*Primary Examiner*—Olik Chaudhuri
*Assistant Examiner*—Erik Kielin
(74) *Attorney, Agent, or Firm*—Birch, Stewart, Kolasch & Birch, LLP (57) ABSTRACT

The present invention provides for a high quality Group III-V compound semiconductor, a method of manufacturing the same, and a light emitting element with an excellent emission characteristic which incorporates such a Group III-V compound semiconductor. The Group III-V compound semiconductor has a structure in which a fifth-layer, which is formed by a Group III-V compound semiconductor which is expressed by a general formula $Ga_aAl_bN$ ($a+b=1$, $0 \leq a \leq 1$, $0 \leq b \leq 1$), a fourth-layer having a lower impurity concentration, which is formed by a Group III-V compound semiconductor which is expressed by a general formula $Ga_{a'}Al_{b'}N$ ($a'+b'=1$, $0 \leq a' \leq 1$, $0 \leq b' \leq 1$), and a first-layer, which is formed by a Group III-V compound semiconductor which is expressed by a general formula $In_xGa_yAl_zN$ ($x+y+z=1$, $0<x<1$, $0<y<1$, $0 \leq z<1$), a second-layer, which is formed by a Group III-V compound semiconductor which is expressed by a general formula $Ga_{x'}Al_{y'}N$ ($x'+y'=1$, $0<x' \leq 1$, $0 \leq y'<1$), and a third-layer, which is formed by a Group III-V compound semiconductor which is expressed by a general formula $Ga_{x''}Al_{y''}N$ ($x''+y''=1$, $0<x'' \leq 1$, $0 \leq y''<1$), are stacked one atop the other in this order, and in which the first-layer has a thickness in the range between 5 Å and 90 Å.

1 Claim, 3 Drawing Sheets

FOREIGN PATENT DOCUMENTS

| | | |
|---|---|---|
| JP | 6-21511 | 1/1994 |
| JP | 6 177423 | 6/1994 |
| JP | 6-268257 | 9/1994 |

OTHER PUBLICATIONS

Nakamura et al., *Jpn. J. Appl. Phys.,* vol. 31, pp. L1457–L1459 (1992).

Nakamura et al., *Jpn. J. Appl. Phys.,* vol. 32 pp. L16–L19 (1993).

Nakamura et al., *Jpn. J. Apppl. Phys.,* vol. 32, pp. L8–L11 (1993).

Nakamura et al., *Appl. Phys. Lett.,* vol. 62, No. 19, pp. 2390–2392 (May 1993).

Nakamura et al., *J. Appl. Phys.,* vol. 74, No. 6, pp. 3911–3915 (Sep. 1993).

Kim et al., *Materials Science and Engineering,* B26, pp. L5–L7 (1994).

Amano et al., *Appl. Phys. Lett.,* vol. 64, No. 11, pp. 1377–1379 (Mar. 1994).

Nakamura et al., *Appl. Phys. Lett.,* vol. 64, No. 13, pp. 1687–1689 (Mar. 1994).

Khan et al., *Appl. Phys. Lett.*, vol. 65, No. 5, pp. 520–521 (Aug. 1994).

Nakamura et al., *J. Appl. Phys.,* vol. 76, No. 12, pp. 8189–8191 (Dec. 1994).

* cited by examiner

LAYERED GROUP III-V COMPOUND SEMICONDUCTOR, METHOD OF MANUFACTURING THE SAME AND LIGHT EMITTING ELEMENT

This is a divisional of application Ser. No. 08/590,574, filed Jan. 24, 1996, now U.S. Pat. No. 6,346,720 the entire contents of which are hereby incorporated by reference and for which priority is claimed under 35 U.S.C. §120; and this application claims priority of Application Nos. 7-016651, 7-078671, 7-178725, and 7-205954 filed in Japan on Feb. 3, 1995; Apr. 4, 1995; Jul. 14, 1995; and Aug. 11, 1995, respectively, under 35 U.S.C. §119.

BACKGROUND OF THE INVENTION

1. Field of the Invention

The present invention is related to a Group III-V compound semiconductor, a method of manufacturing the same, and a light emitting element.

2. Description of the Background Art

Group III-V compound semiconductors, which are expressed by the following general formula $In_xGa_yAl_zN$ ($x+y+z=1$, $0 \leq x<1$, $0<y \leq 1$, $0 \leq z<1$), are known as a material for a light emitting element such as a light emitting diode which emits ultraviolet light or blue light and a laser diode which emits ultraviolet light or blue light. Hereafter, x, y and z in the above mentioned general formula will be stated as In concentration, Ga concentration and Al concentration, respectively. Those in which the In concentration is 10% or more, in particular, are important for the purpose of display, since an emission wavelength in a visible range can be adjusted in accordance with the concentration of In.

However, big problems as described below have been impeding efforts to develop light emitting elements which use Group III-V compound semiconductors into a practical use. That is, first, no appropriate substrate has been found which can be used for growing crystal of a Group III-V compound semiconductor, and second, thermal stability of a Group III-V compound semiconductor is not excellent. Now, a detailed description will be given on these points.

Describing the first problem, despite the efforts to grow a Group III-V compound semiconductor on various substrates such as a sapphire substrate, a GaAs substrate and a ZnO substrate, since these substrates have largely different lattice constants and chemical characteristics from the Group III-V compound semiconductor, crystal of a sufficiently high quality has not been produced yet. To deal with this, an approach has been proposed which requires to grow GaN crystal which has a similar lattice constant and chemical characteristics to a Group III-V compound semiconductor first, and thereafter to grow a Group III-V compound semiconductor on the GaN crystal, so as to obtain excellent crystal (Japanese Examined Patent Publication No. 55-3834). However, it is known that a difference in lattice constant between the Group III-V compound semiconductor and GaN becomes larger as the In concentration increases, so that the crystal perfection deteriorates and the number of defects increases, even in this approach. Thus, it is difficult to manufacture a Group III-V compound semiconductor which has a high quality and a high In concentration.

Secondly, it is known that such compound semiconductors which contain In have substantially low decomposition temperatures than such compound semiconductors which do not contain In. For example, while GaN, AlN and mixed crystal of the two are relatively stable at a temperature of 1,000° C. or higher, the thermal decomposition temperature of InN is about 600° C. Although it depends on the In concentration, the compound semiconductors which contain In cause crystal deterioration at a temperature exceeding 1,000° C. and create an increased number of defects, in general.

On the other hand, it is necessary to dispose a p-type current injection layer and an n-type current injection layer on both sides of an active layer to manufacture a light emitting element which is driven at a low voltage. As known in the art, while a compound semiconductor of n-type is easily manufactured, a compound semiconductor of p-type is very difficult to manufacture.

Further, to realize a high p-type conductivity, it is sometimes effective to perform post processing, such as thermal annealing or electron beam irradiation, on a layer which is doped with acceptor type impurities. In general, such processing is likely to be very effective when the layer which is doped with acceptor type impurities is exposed to a surface. Hence, it is preferable to grow the p-type current injection layer after forming the active layer. In addition, it is known that compound semiconductors which do not contain In more easily exhibit p-type conductivity than compound semiconductors which contain In.

For this reason, $Ga_{x''}Al_{y''}N$ ($x''+y''=1$, $0<x'' \leq 1$, $0 \leq y''<1$) which does not contain In is used as the p-type current injection layer. However, to obtain $Ga_{x''}Al_{y''}N$ which exhibits excellent p-type conductivity, it is necessary to grow $Ga_{x''}Al_{y''}N$ at a temperature exceeding 1,000° C. Hence, while $Ga_{x''}Al_{y''}N$ of p-type is grown at a temperature exceeding 1,000° C., the active layer which contains In is deteriorated.

SUMMARY OF THE INVENTION

An object of the present invention is to obtain a Group III-V compound semiconductor which has a high quality and less defects, to obtain a method of manufacturing the same in which after an In containing layer is grown, GaAlN doped with p-type impurities is grown at a temperature exceeding 1,000° C., without deteriorating the In containing layer, so that a resultant Group III-V compound semiconductor exhibits an excellent emission characteristic, and further, to obtain a light emitting elements using such a Group III-V compound semiconductor which exhibits an excellent emission characteristic.

As a result of a wide range of study on Group III-V compound semiconductors, the inventors of the present invention have found that Group III-V compound semiconductor crystal which has a high quality and less defects is obtained if a Group III-V compound semiconductor has a specific laminated structure and if a Group III-V compound semiconductor which is expressed by a general formula $In_xGa_yAl_zN$ ($x+y+z=1$, $0<x<1$, $0<y<1$, $0 \leq z<1$), is a specific thin layer, and that the thermal stability of the compound semiconductors is improved if a GaAlN layer is grown at a relatively low temperature as a protection layer after a layer which contains In is grown.

That is, the present invention is directed to [1] a Group III-V compound semiconductor having a structure in which a first-layer, which is formed by a Group III-V compound semiconductor which is expressed by a general formula $In_xGa_yAl_zN$ ($x+y+z=1$, $0<x<1$, $0<y<1$, $0 \leq z<1$), a second-layer, which is formed by a Group III-V compound semiconductor which is expressed by a general formula $Ga_{x'}Al_{y'}N$ ($x'+y'=1$, $0<x' \leq 1$, $0 \leq y'<1$), and a third-layer, which is formed by a Group III-V compound semiconductor which is expressed by a general formula $Ga_{x''}Al_{y''}N$ ($x''+

$y''=1$, $0<x''\leq 1$, $0\leq y''<1$), are stacked one atop the other in this order, and in which the first-layer has a thickness in the range between 5 Å and 90 Å.

The present invention is also directed to [2] a Group III-V compound semiconductor having a structure in which a fifth-layer, which is formed by a Group III-V compound semiconductor which is expressed by a general formula $Ga_aAl_bN$ ($a+b=1$, $0\leq a\leq 1$, $0\leq b\leq 1$), and a first-layer, which is formed by a Group III-V compound semiconductor which is expressed by a general formula $In_xGa_yAl_zN$ ($x+y+z=1$, $0<x<1$, $0<y<1$, $0\leq z<1$), are stacked one atop the other in this order, and in which the first-layer has a thickness in the range between 5 Å and 90 Å.

The present invention is also directed to [3] a Group III-V compound semiconductor having a structure in which a fifth-layer, which is formed by a Group III-V compound semiconductor which is expressed by a general formula $G_a\&Al_bN$ ($a+b=1$, $0\leq a\leq 1$, $0\leq b\leq 1$), a fourth-layer having a lower impurity concentration than the fifth-layer, which is formed by a Group III-V compound semiconductor which is expressed by a general formula $Ga_{a'}Al_{b'}N$ ($a'+b'=1$, $0\leq a'\leq 1$, $0\leq b'\leq 1$), and a first-layer, which is formed by a Group III-V compound semiconductor which is expressed by a general formula $In_xGa_yAl_zN$ ($x+y+z=1$, $0<x<1$, $0<y<1$, $0\leq z<1$), are stacked one atop the other in this order, and in which the first-layer has a thickness in the range between 5 Å and 90 Å.

The present invention is also directed to [4] a Group III-V compound semiconductor having a structure in which a fifth-layer, which is formed by a Group III-V compound semiconductor which is expressed by a general formula $Ga_aAl_bN$ ($a+b=1$, $0\leq a\leq 1$, $0\leq b\leq 1$), a fourth-layer having a lower impurity concentration than the fifth-layer, which is formed by a Group III-V compound semiconductor which is expressed by a general formula $Ga_{a'}Al_{b'}N$ ($a'+b'=1$, $0\leq a'\leq 1$, $0\leq b'\leq 1$), and a first-layer, which is formed by a Group III-V compound semiconductor which is expressed by a general formula $In_xGa_yAl_zN$ ($x+y+z=1$, $0<x<1$, $0<y<1$, $0\leq z<1$), a second-layer, which is formed by a Group III-V compound semiconductor which is expressed by a general formula $Ga_{x'}Al_{y'}N$ ($x'+y'=1$, $0<x'\leq 1$, $0\leq y'<1$), and a third-layer, which is formed by a Group III-V compound semiconductor which is expressed by a general formula $Ga_{x''}Al_{y''}N$ ($x''+y''=1$, $0<x''\leq 1$, $0\leq y''<1$), are stacked one atop the other in this order, and in which the first-layer has a thickness in the range between 5 Å and 90 Å.

The present invention is also directed to [5] a method of manufacturing a Group III-V compound semiconductor in which after growing a first-layer which is formed by a Group III-V compound semiconductor which is expressed by a general formula $In_xGa_yAl_zN$ ($x+y+z=1$, $0<x<1$, $0<y<1$, $0\leq z21\ 1$), a third-layer which is formed by a Group III-V compound semiconductor which is expressed by a general formula $Ga_{x''}Al_{y''}N$ ($x''+y''=1$, $0<x''\leq 1$, $0\leq y''<1$) is grown at a temperature exceeding 1,000° C., the method being characterized in that a second-layer which is formed by a Group III-V compound semiconductor which is expressed by a general formula $Ga_{x'}Al_{y'}N$ ($x'+y'=1$, $0<x'\leq 1$, $0\leq y'<1$) is grown at 1,000° C. or a lower temperature after growing the first-layer but before growing the third-layer.

Further, the present invention is directed to [6] a Group III-V compound semiconductor described in [1], [4] and [5] in which Mg concentration in a second-layer which is formed by a Group III-V compound semiconductor expressed by a general formula $Ga_{x'}Al_{y'}N$ ($x'+y'=1$, $0<x'\leq 1$, $0\leq y'<1$), is $10^{19}$/cm$^3$ or less.

Still further, the present invention is directed to [7] a light emitting element which uses such a Group III-V compound semiconductor.

The Group III-V compound semiconductors according to the present invention have a high quality and less defects. Using these Group III-V compound semiconductors, it is possible to provide for a light emitting element which has a high luminescence efficiency and an excellent emission characteristic.

In addition, according to the methods of manufacturing a Group III-V compound semiconductor according to the present invention, even if GaAlN doped with p-type impurities is grown at a temperature exceeding 1,000° C. after growing a layer which contains In, the In containing layer does not deteriorate, so that a Group III-V compound semiconductor which has a high quality and less defects is obtained.

These and other objects, features, aspects and advantages of the present invention will become more apparent from the following detailed description of the present invention when taken in conjunction with the accompanying drawings.

DESCRIPTION OF TEE PREFERRED EMBODIMENTS

Now, the present invention will be described in detail.

A Group III-V compound semiconductor is characterized in that it has a structure in which a fifth-layer, which is formed by a Group III-V compound semiconductor which is expressed by a general formula $Ga_aAl_bN$ ($a+b=1$, $0\leq a\leq 1$, $0\leq b\leq 1$), and a first-layer, which is formed by a Group III-V compound semiconductor which is expressed by a general formula $In_xGa_yAl_zN$ ($x+y+z=1$, $0<x<1$, $0<y<1$, $0\leq z<1$), are stacked one atop the other in this order, and in that the first-layer has a thickness in the range between 5 Å and 90 Å.

If the thickness of the first-layer is smaller than 5 Å or larger than 90 Å, the luminescence efficiency of a light emitting element which uses the Group III-V compound semiconductor is poor, which is not desirable.

When the first-layer is doped with impurities, emitted light has a wavelength which is different from the band gap of the first-layer. Since the light is emitted from the impurities, this is called impurity-activated emission. In the case of impurity-activated emission, the emission wavelength is determined by a composition of Group III elements and impurity elements in the first-layer. In this case, the concentration of In in the first-layer is preferably 5% or more for an application of display. When the concentration of In is smaller than 5%, most of the emitted light is ultraviolet ray, which is disadvantageously not bright enough to be sensed by human eyes. The emission wavelength becomes longer as the concentration of In becomes larger, so that the emission wavelength is adjusted from violet to blue, and blue to green.

It is preferable to use Group II elements as impurities which are suitable for impurity-activated emission. Among Group II elements, when Mg, Zn or Cd is doped, the luminescence efficiency is advantageously high. It is particularly preferable to use Zn. The concentration of these elements is preferably $10^{18}$-$10^{22}$/cm$^3$. In addition to these Group II elements, Si or Ge may be doped into the first-layer at the same time. The concentration of Si and Ge preferably ranges from $10^{18}$-$10^{22}$/cm$^3$.

The emission spectrum of impurity-activated emission is broad, in general. Hence, when a high color purity is demanded, or when it is necessary to concentrate emission power in a narrow wavelength range, band edge emission is utilized. To realize a light emitting element utilizing band edge emission, the quantity of impurities which are contained in the first-layer must be suppressed small. More precisely, the concentration of any one of the elements Si, Ge, Zn, Cd and Mg is preferably $10^{19}$/cm$^3$ or smaller, and more preferably, is $10^{18}$/cm$^3$ or smaller.

In the case of band edge emission, the wavelength of emitted light is determined by a composition of Group III elements in the first-layer. When emission is to be created in the visible range, the concentration of In is preferably 10% or larger. If the concentration of In is smaller than 10%, most of the emitted light is a ultraviolet ray, which is disadvantageously not bright enough to be sensed by human eyes. The emission wavelength becomes longer as the concentration of In becomes larger, so that the emission wavelength is adjusted from violet to blue, and blue to green Although the first-layer as described above has a good crystal perfection, the thermal stability of the first-layer may be insufficient in some cases. When a layer structure as described below is used, therefore, it is possible to grow subsequent layers without thermally deteriorating the first-layer, and hence, to manufacture a light emitting element which has an even better luminescence efficiency.

That is, a Group III-V compound semiconductor according to the present invention has a structure in which a first-layer, which is formed by a Group III-V compound semiconductor which is expressed by a general formula In$_x$Ga$_y$Al$_z$N (x+y+z=1, 0<x<1, 0<y<1, 0≦z<1), a second-layer, which is formed by a Group III-V compound semiconductor which is expressed by a general formula Ga$_{x'}$Al$_{y'}$N (x'+y'=1, 0<x'≦1, 0≦y'<1), and a third-layer, which is formed by a Group III-V compound semiconductor which is expressed by a general formula Ga$_{x''}$Al$_{y''}$N (x''+y''=1, 0<x''≦1, 0≦y''<1), are stacked one atop the other in this order, and the Group III-V compound semiconductor is characterized in that the first-layer has a thickness in the range between 5 Å and 90 Å. The thickness of the first-layer is preferably in the range between 10 Å and 80 Å.

The thickness of the second-layer is preferably in the range between 50 Å and 1 μm. Preferably, the thickness of the second-layer is in the range between 70 Å and 5,000 Å. If the thickness of the second-layer is smaller than 50 Å, the thermal stability of the first-layer becomes insufficient so that the first-layer deteriorates during growth of the third-layer. If the thickness of the second-layer is larger than 1 μm, an element which is eventually obtained does not have sufficiently large emission intensity, which is not desirable.

Considering the thermal stability of the active layer, the concentration (x'') of Al in the second-layer is preferably 0.05≦x''. However, since an electric resistance tends to increase as the concentration of Al becomes larger, the concentration of Al is preferably set to satisfy x''≦0.5 so that the electric resistance of the element does not become especially high. More preferably, the concentration of Al is set in the range 0.1≦x''≦0.45.

Considering electric characteristics, the second-layer is preferably p-type. It is necessary to heavily dope the layer with acceptor type impurities to form the second-layer p-type. To be specific, Group II elements are used as the acceptor type impurities. Of the Group II elements, the acceptor type impurities are preferably Mg or Zn, or more preferably, Mg. while it is preferable that the second-layer is doped with acceptor type impurities of $10^{20}$/cm$^3$ or a higher concentration to form the second-layer p-type, the crystal perfection, may deteriorate in some cases when the second-layer contains impurities of a high concentration, thereby eventually deteriorating characteristics of the element. To deal with this, the impurity concentration needs be lowered. The range of the impurity concentration which does not deteriorate the crystal perfection is preferably $10^{19}$/cm$^3$ or smaller, and more preferably, $10^{18}$/cm$^3$ or smaller.

A p-type layer on the top portion may be annealed after grown, so as to further reduce the resistance of the p-type layer. An a-type layer is exposed by locally etching the p-type third-layer, the second-layer and the first-layer, and an n-electrode is formed in the exposed portion while a p-electrode is formed directly on the p-type third-layer, whereby a light emitting element is formed. When a current is allowed in a forward-direction through these electrodes, desired emission is created.

The first-layer of III-V compound semiconductor layer is as described earlier.

Figure 1:
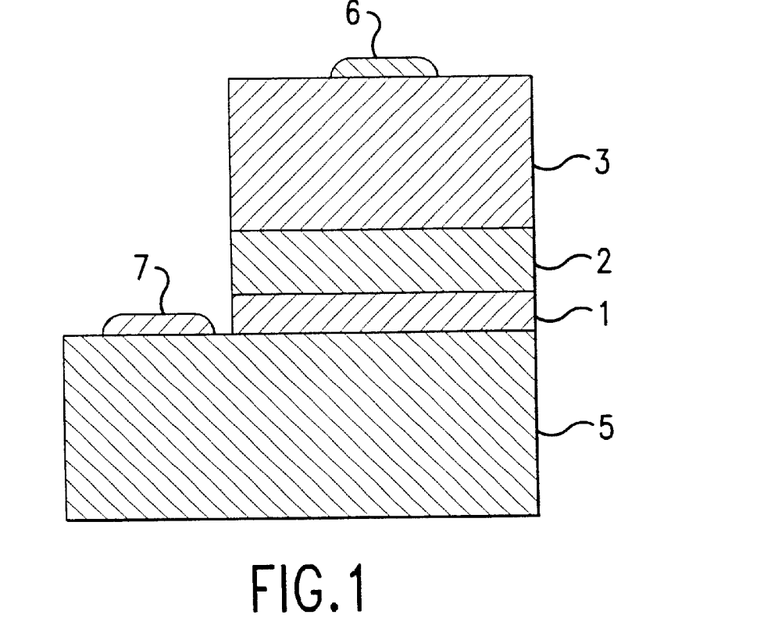
FIG. 1 is a view showing the structure of a light emitting element according to the present invention (i.e., the structure of a light emitting element which is manufactured according to the second embodiment)
Figure 2:
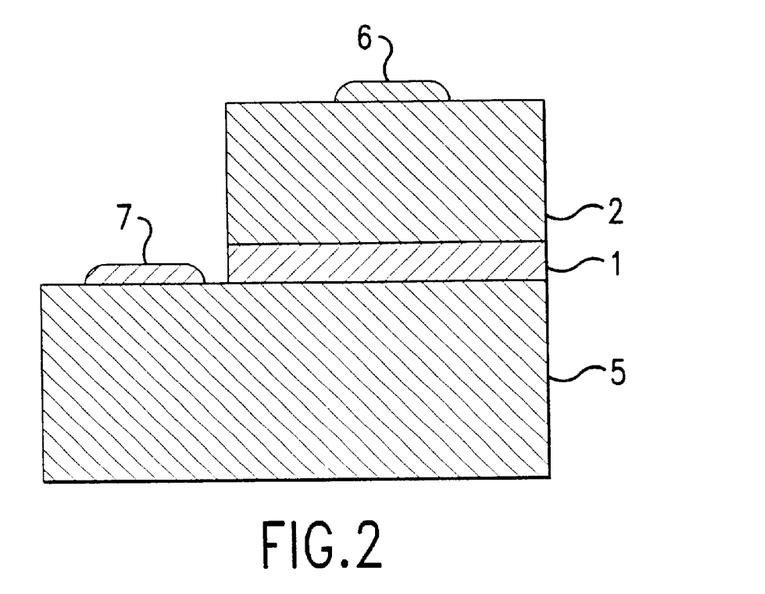
FIG. 2 is a view showing the structure of a light emitting element according to the present invention.

FIGS. 1 and 2 show examples of the structure of a light emitting element which uses the III-V compound semiconductor according to the present invention. FIG. 1 shows an example where the first-layer is formed on the fifth-layer, the second-layer which has a larger band gap than the first-layer is formed on the first-layer, and the third-layer which has a different conductivity from the fifth-layer is further formed. Electrodes are formed in the fifth-layer and the third-layer. When a voltage is applied to the two electrodes, a current flows and the first-layer emits light.

FIG. 2 shows an example where the second-layer has a different conductivity from the fifth-layer. As in the example shown in FIG. 1, light is emitted when a voltage is applied. In general, the fifth-layer is n-type while the third-layer is p-type to make it easy for crystal to grow. In the example shown in FIGS. 2 which does not include the third-layer, the second-layer is p-type.

Figure 3:
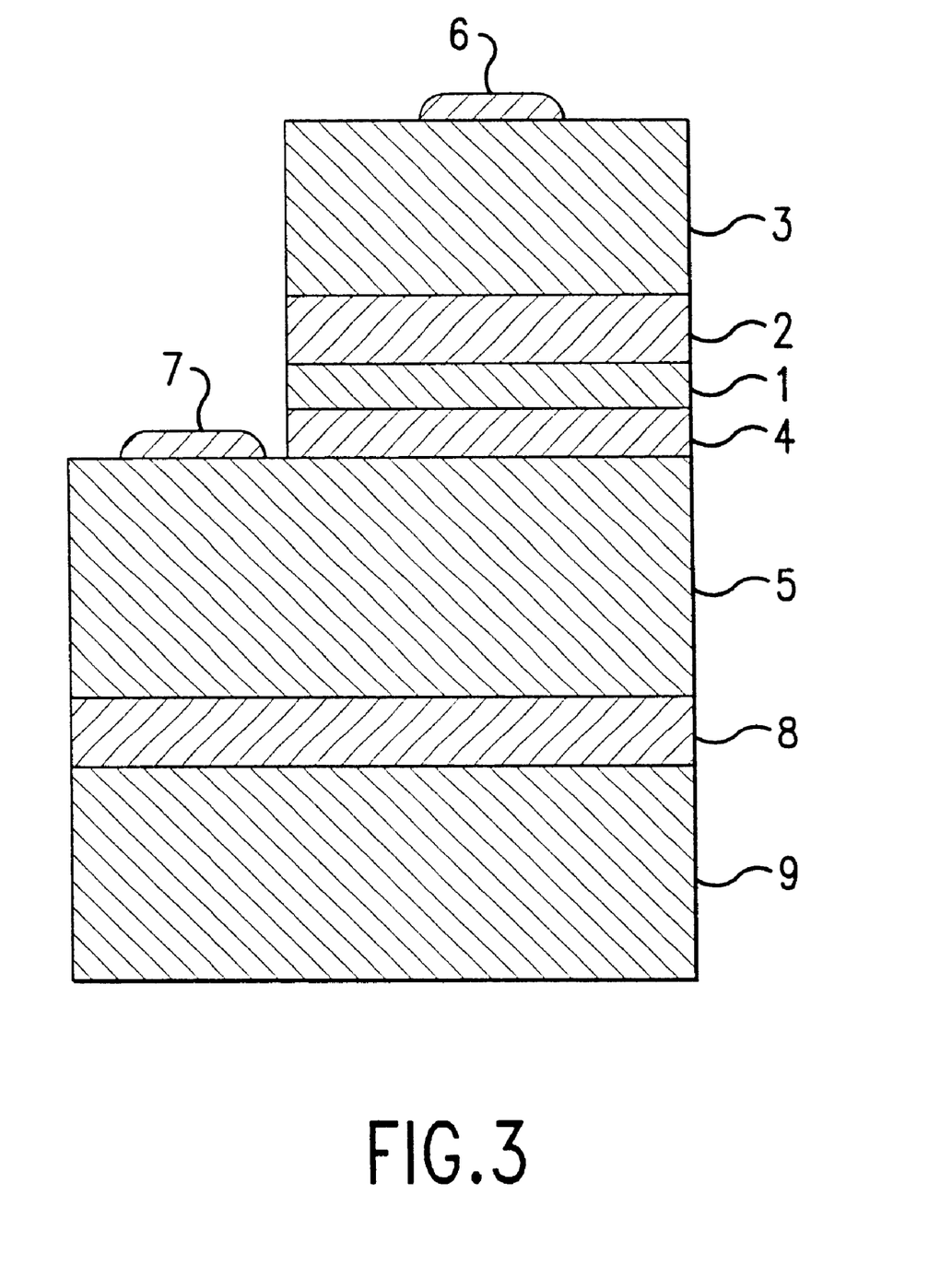
FIG. 3 is a view showing the structure of a light emitting element according to the present invention (i.e., the structure of a light emitting element which is manufactured according to the first embodiment).

Heavily doped with impurities, the n-type fifth-layer may have a deteriorated crystal perfection in some cases. In such a case, if the n-type fifth-layer and the first-layer are in a direct contact, the luminescence efficiency and electric characteristics may deteriorate. This problem can be mitigated in some cases by forming a fourth-layer which has a low impurity concentration, between the n-type fifth-layer and the first-layer. FIG. 3 shows such an example.

That is, a Group III-V compound semiconductor according to the present invention has a structure in which a fifth-layer, which is formed by a Group III-V compound semiconductor which is expressed by a general formula Ga$_a$Al$_b$N (a+b=1, 0≦a≦1, 0≦b≦1), a fourth-layer having a lower impurity concentration than the fifth-layer, which is formed by a Group III-V compound semiconductor which is expressed by a general formula Ga$_{a'}$Al$_{b'}$N (a'+b'=1, 0≦a'≦1, 0≦b'≦1), and a first-layer, which is formed by a Group III-V compound semiconductor which is expressed by a general formula In$_x$Ga$_y$Al$_z$N (x+y+z=1, 0<x<1, 0<y<1, 0≦z<1), are stacked one atop the other in this order, and the Group III-V compound semiconductor is characterized in that the first-layer has a thickness in the range between 5 Å and 90 Å.

When Si is used as n-type impurities, in the fourth-layer which has a low Si concentration, the concentration of Si is preferably $10^{18}$/cm$^3$, or more preferably, $10^{17}$/cm$^3$ or smaller.

In addition, the thickness of the layer is in the range between 10 Å and 1 μm, or more preferably, in the range between 20 Å and 5,000 Å. If the thickness of the layer is smaller than 10 Å, an effect created is not sufficient. If the thickness of the layer is larger than 1 μm, electric characteristics disadvantageously deteriorate.

If the laminated structures of the Group III-V compound semiconductors according to the present invention as described above are combined with each other, a Group III-V compound semiconductor is obtained which realizes a light emitting element which has an even better luminescence efficiency.

That is, a Group III-V compound semiconductor according to the present invention has a structure in which a fifth-layer, which is formed by a Group III-V compound semiconductor which is expressed by a general formula Ga$_a$Al$_b$N (a+b=1, 0≦a≦1, 0≦b≦1), a fourth-layer having a lower impurity concentration than the fifth-layer, which is formed by a Group III-V compound semiconductor which is expressed by a general formula Ga$_{a'}$Al$_{b'}$N (a'+b'=1, 0≦a'≦1, 0≦b'≦1), and a first-layer, which is formed by a Group III-V compound semiconductor which is expressed by a general formula In$_x$Ga$_y$Al$_z$N (x+y+z=1, 0<x<1, 0<y<1, 0≦z<1), a second-layer, which is formed by a Group III-V compound semiconductor which is expressed by a general formula Ga$_{x'}$Al$_{y'}$N (x'+y'=1, 0<x'≦1, 0≦y'<1), and a third-layer, which is formed by a Group III-V compound semiconductor which is expressed by a general formula Ga$_{x''}$Al$_{y''}$N (x''+y''=1, 0<x''≦1, 0≦y''<1), are stacked one atop the other in this order, and the Group III-V compound semiconductor is characterized in that the first-layer has a thickness in the range between 5 Å and 90 Å.

Using such a Group III-V compound semiconductor which is formed by at least five layers, it is possible to obtain a light emitting element which has an excellent luminescence efficiency.

FIG. 3 shows an example of the laminated structure of the light emitting element.

In order to confine charge carriers in the first-layer, the bandgap of the two layers which sandwich the first-layer is preferably 0.1 eV or more than the bandgap of the first-layer. More preferably, the bandgap is 0.3 eV or more than that of the first-layer.

Although the examples of the light emitting elements of the present invention shown in FIGS. 1, 2 and 3 have light emitting layer composed of a single layer, light emitting function can be also achieved by a laminated structure of two or more layers. As an example of the laminated structure of two or more layers which has light emitting function, lamination of two or more active layers which are sandwiched by layers having larger bandgaps than the active layers, so called multiple quantum well structure, can be used.

As a substrate of the Group III-V compound semiconductors of the present invention, Si, Sic, sapphire, etc., can be used. The Group III-V compound semiconductors of the present invention of high quality can be grown on a buffer layer of thin AlN, GaN, Group III-V compound semiconductors expressed by a general formula Ga$_s$Al$_t$N (s+t=1, 0<s<1, 0<t<1), or lamination of these layers grown on the above mentioned substrate.

A method of manufacturing Group III-V compound semiconductors according to the present invention may be molecular beam epitaxy (hereinafter abbreviated as "MBE" in some cases), metal-organic vapor phase epitaxy (hereinafter abbreviated as "MOVPE" in some cases), hydride vapor phase epitaxy (hereinafter abbreviated as "HVPE" in some cases), etc. A method which is generally used as MBE method is gas source molecular beam epitaxy (hereinafter abbreviated as "GSMBE" in some cases) in which nitrogenous materials such as nitrogen gas, ammonia and other nitrogenous compounds in vapor phase are supplied. When this method is used, nitrogenous materials are chemically inactive in some cases, which makes it less easy for nitrogen atoms to be incorporated into crystal. If such is the case, using a microwave or the like, the nitrogenous materials may be activated and supplied as they are in an active state, so that the efficiency of incorporating nitrogen is improved.

In MOVPE method, the following materials can be used.

Materials of Group III: elements include: trialkylgallium which is expressed by a general formula R$_1$R$_2$R$_3$Ga (where R$_1$, R$_2$ and R$_3$ denote lower alkyl groups) such as trimethylgallium [(CH$_3$)$_3$Ga, hereinafter abbreviated as "TMG" in some cases] and triethylgallium [(C$_2$H$_5$)$_3$Ga, hereinafter abbreviated as "TEG" in some cases]; trimethylaluminum [(CH$_3$)$_3$Al], triethylaluminum [(C$_2$H$_5$)$_3$Al, hereinafter abbreviated as "TEA" in some cases], triisobutylaluminum [i-(C$_4$H$_9$)$_3$Al] and the like which are expressed by a general formula R$_1$R$_2$R$_3$Al (the definitions of the symbols R$_1$, R$_2$ and R$_3$ are the same as above); and trialkylindium which is expressed by a general formula R$_1$R$_2$R$_3$In (the definitions of the symbols R$_1$, R$_2$ and R$_3$ are the same as above) such as trimethylidium [(CH$_3$)$_3$In, hereinafter abbreviated as "TMI" in some cases] and triethylindium [(C$_2$H$_3$)$_3$In].

Next, materials of Group V elements include ammonia, hydrazine, methylhydrazine, 1, 1-dimethylhydrazine, 1-, 2-dimethylhydrazine, t-butylamine, ethylenediamine. These substances are used as they singularly are, or as they are mixed. Of these substances, since ammonia and hydrazine do not contain carbon atoms in molecules, ammonia and hydrazine are suitable substances which create less pollution in a semiconductor with carbon.

In the case of MOVPE method, preferable growth pressure for the Group III-V compound semiconductors is in the range of 1-0.001 atm. If the growth pressure is higher than 1 atm, efficiency of raw materials used for the growth and uniformity of the thickness of the grown film are both low. In general, although decreasing the growth pressure, the uniformity becomes high, almost no higher uniformity is obtained and sometimes only crystals of poor quality can be obtained in the growth pressure range less than 0.001 atm. More preferable growth pressure is in the range of 1-0.01 atm.

Now, a description will be given particularly on a method of growing a Group III-V compound a miconductor, which requires to grow a third-layer, which is formed by a Group III-V compound semiconductor which is expressed by a general formula Ga$_{x''}$Al$_{y''}$N (x''+y''=1, 0<x''≦1, 0≦y''<1), at a temperature exceeding 1,000° C., after growing a first-layer which is formed by a Group III-V compound semiconductor which is expressed by a general formula $In_xGa_y$-$Al_zN$ (x+y+z=1, 0<x<1, 0<y<1, 0≦z<1).

The manufacturing method of a Group III-V compound semiconductor according to the present invention is characterized in that a second-layer, which is formed by a Group III-V compound semiconductor which is expressed by a general formula $Ga_{x'}Al_{y'}N$ (x'+y'=1, 0<x'≦1, 0≦y'<1), is grown at 1,000° C. or a lower temperature, after growing the first-layer but before growing the third-layer.

When films are grown in MOVPE method, it is preferable to grow the second-layer and the third-layer in atmosphere which does not contain hydrogen If grown in atmosphere which contains hydrogen, the first-layer deteriorates, thereby making it impossible to manufacture an element which has an excellent characteristic.

The second-layer is grown at 1,000° C. or a lower temperature. Preferably, the second-layer is grown at a temperature in the range between 400° C. and 1,000° C. More preferably, the temperature range is between 500° C. and 900° C. If the film is grown at too high a temperature, since the first-layer, or the active layer, deteriorates during the growth of the second-layer, an eventually fabricated light emitting element has a problem, such as a failure to emit a color which is expected from the composition of the elements which are contained in the active layer and insufficient emission intensity. Conversely, if the film is grown at too low a temperature, the film growth speed becomes unpractically slow.

In this manufacturing method of a Group III-V compound semiconductor, the film thickness of the first-layer is preferably in the range between 5 Å and 500 Å. When an expected use is a light emitting element which has a large emission intensity, in particular, the film thickness of the first-layer is preferably in the range between 5 Å and 90 Å. If the film thickness is thinner than 5 Å or thicker than 500 Å, when the compound semiconductor is used to form a light emitting element, the luminescence efficiency is insufficient, which is not desirable.

Now, the present invention will be described in more detail, in relation to embodiments. However, the description hereinafter is not intended to limit the present invention.

First Embodiment

A light emitting element having the structure which is shown in FIG. 3 was manufactured. In the following, a description will be given on the light emitting element, with reference to FIG. 3. As described below, Group III-V compound semiconductor layers were fabricated by MOVPE method.

Silane diluted with nitrogen ($SiH_4$) was used as an n-type dopant source to dope Si, while biscyclopentadienyl magnesium [$(C_5H_5)_2Mg$, hereinafter abbreviated as "$Cp_2Mg$" in some cases] was used as a p-type dopant source to dope Mg.

Used as a substrate is a C-face of sapphire after polished by mirror polishing and cleaned by organic cleaning. First, using hydrogen as carrier gas, hydrogen chloride was supplied at a temperature of 1,100° C. to clean a reaction furnace and the substrate. After the cleaning, TMG and ammonia were supplied at a substrate temperature of 550° C. to form a buffer layer 8 of GaN having a film thickness of 500 Å.

Next, the substrate temperature was increased up to 1,100° C. TMG, ammonia and silane gas were supplied to grow a layer 5 of Si-doped GaN having an n-type carrier concentration of $1\times10^{19}/cm^3$ and a film thickness of about 3 μm. Further, at the same temperature, an non-doped GaN layer 4 was grown 1,500 Å. The film growth speeds of growing the Si-doped layer and the non-doped layer were 1,000 Å/min and 200 Å/min, respectively.

Next, the substrate temperature was decreased down to 785° C., the carrier gas was switched to nitrogen, and 0.04 sccm of TEG, 0.08 sccm of TMI and 4 slm of ammonia were supplied to grow an $In_{0.3}Ga0.7N$ layer 1, i.e., a light emitting layer, for seventy seconds. After the growth of the light emitting layer, only the carrier gas and ammonia were supplied for 5 minutes.

Further, at the same temperature, 0.032 sccm of TEG, 0.008 sccm of TEA and 4 slm of ammonia were supplied to grow a $Ga_{0.9}Al_{0.2}N$ layer 2, i.e., a protection layer, for ten minutes.

The units "slm" and "sccm" are units of gas flow. If the value is 1 slm, it means that gas which flows per minute has such weight which measures 1 liter in cubic volume in the normal state. The quantity of 1,000 sccm corresponds to the quantity of 1 slm.

The growth speeds of growing these two layers, which were calculated from the thicknesses of equivalent layers which were grown for a longer period of time under the same conditions, are 43 Å/min and 30 Å/min, respectively. Hence, from the growth speeds above, the thicknesses of these two layers are calculated as 50 Å and 300 Å, respectively.

Next, after increasing the substrate temperature up to 1,100° C. and after supplying $Cp_2Mg$ and ammonia for forty seconds, TMG, $Cp_2Mg$ and ammonia were supplied to grow a Mg-doped GaN layer 3 to a thickness of 5,000 Å.

After taking out the Group III-V compound semiconductor sample fabricated in this manner from the reaction furnace, the sample was annealed for twenty minutes in nitrogen atmosphere at 800° C., whereby the Mg-doped GaN layer became a p-type layer which has a low resistance. Electrodes were formed in the sample which was fabricated in this manner by a known method, thereby completing an LED. A p-type electrode is made of Ni—Au alloy, and an n-type electrode is made of Al. When carried a current, the LED emitted clear blue light having an emission wavelength of 4,570 Å. The luminance was 1,200 mcd with 20 mA.

Second Embodiment

A light emitting element having the structure which is shown in FIG. 1 was manufactured. In the following, a description will be given on the light emitting element, with reference to FIG. 1.

The gallium nitride semiconductor was fabricated by MOVPE method.

Used as a substrate is a C-face of sapphire after polished by mirror polishing and cleaned by organic cleaning. To grow the structure, first, the substrate was heated to 1,100° C. in hydrogen and made to react with HCl gas within a reaction furnace in this state, and a susceptor and the substrate were then etched by vapor phase etching. After stopping the supply of HCl gas, the substrate was cleaned in hydrogen at 1,100° C.

Next, after growing GaN as a buffer layer which has a thickness of 500 Å at 600° C. using TMG and ammonia, the Si-doped GaN layer 5 was grown into a thickness of 3 μm at 1,100° C., using silane ($SiH_4$) as a dopant in addition to TMG and ammonia.

After decreasing the temperature to 800° C., the carrier gas was switched to nitrogen to grow the $In_{0.17}Ga_{0.83}N$ layer 1 to a thickness of 60 Å and the $Ga_{0.8}Al_{0.2}N$ layer 2 to a thickness of 300 Å, using TEG, TMI and TEA. Following this, after increasing the temperature to 1,100° C., using bismethylcyclopentadienyl magnesium [(CH$_3$C$_5$H$_4$)$_2$Mg, hereinafter abbreviated as "MCp$_2$Mg" in some cases] as a dopant in addition to TMG and ammonia, the Mg-doped GaN layer 3 was grown 5,000 Å. The substrate was taken out after growing the layer 3, and thermally processed at 800° C. in nitrogen.

Electrodes were formed in the sample which was fabricated in this manner by a known method, thereby completing an LED. A p-type electrode is made of Ni—Au alloy, and an n-type electrode is made of Al. When carried a current of 20 mA, the LED emitted clear blue light. The luminance was 120 mcd.

FIRST EXAMPLE TO COMPARE

An LED was manufactured in the same manner as in the second embodiment, except for a point that the InGaN layer was formed to a thickness of 100 Å, and evaluated in the same manner as in the second embodiment. Brightness of LEDS from almost whole the wafer was less than 10 mcd, although an LED from quite near the edge of the wafer showed clear blue emission.

Third Embodiment

Figure 4:
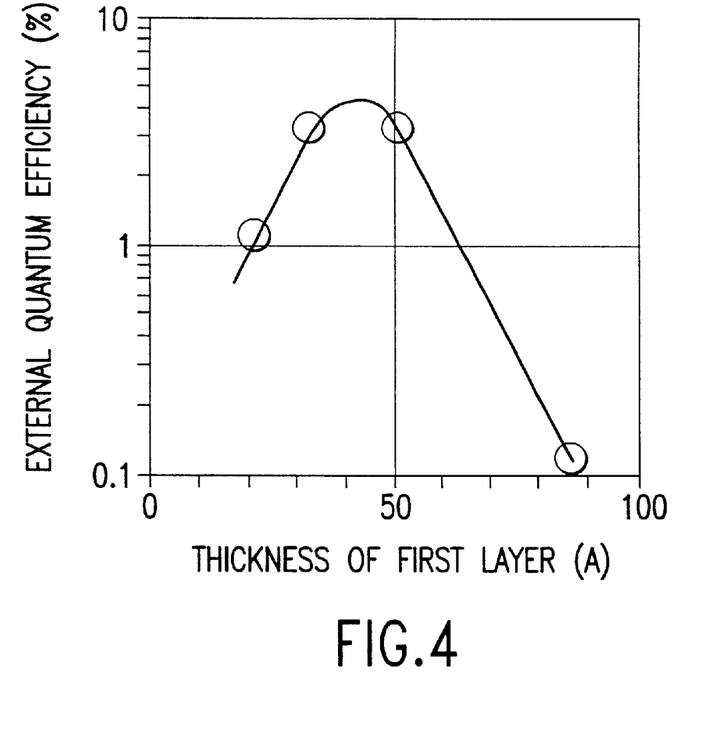
FIG. 4 is a graph showing the relationship between the external quantum efficiency of LEDs manufactured in First and third Embodiments at 20 mA and the thickness of the first-layer.

Samples of Group III-V compound semiconductors were manufactured by the same way as in Embodiment 1, except that the thicknesses of the first-layer were 21, 32, 86 Å. Also by the same way as described in First Embodiment, LEDs were made from these samples by forming electrodes and examined. All the LEDs showed clear blue light emission of more than 20 mcd at a forward current of 20 mA. FIG. 4 shows a relationship between the thickness of the first layer and the typical external quantum efficiency of the LEDs at 20 mA.

SECOND EXAMPLE TO COMPARE

A sample of Group III-V compound semiconductor was manufactured by the same way as in Embodiment 1, except that the thickness of the first-layer was 150 Å. Also by the same way as described in First Embodiment, an LED was made from the sample by forming electrodes and examined. The LED Showed only weak blue light emission at a forward current of 20 MA. The brightness at 20 mA was less than 1/10,000 of the LED in First embodiment.

Fourth, Fifth and Sixth Embodiments

Figure 5:
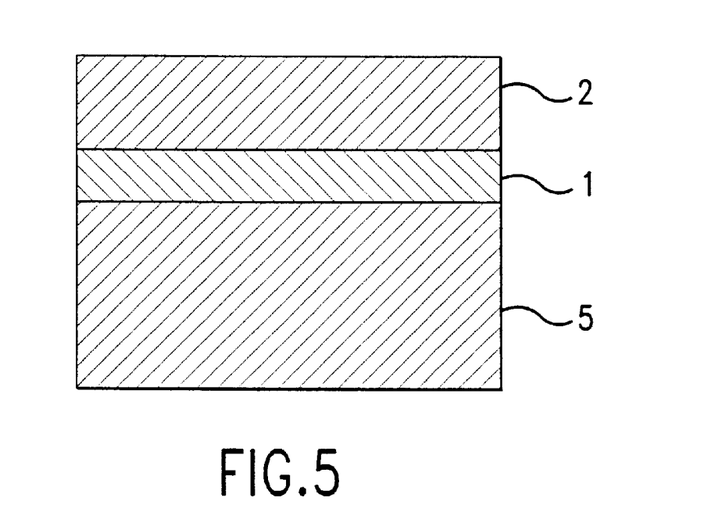
FIG. 5 is a view showing the structure of III-V semiconductors manufactured in the fourth, fifth and sixth Embodiments.

Samples of the structure shown in FIG. 5 were manufactured as follows. Firstly, a fifth-layer of non-doped 3 μm thick GaN were grown at 1100° C., then a first-layer of 50 thick non-doped InGaN in the temperature range of 785-825° C. was grown. A second-layer of non-doped GaAlN was further grown at the same temperature as the first-layer. After the growth, thermal stability of the first-layer of these samples was examined by evaluating the intensity change of photoluminescence (hereafter, abbreviated as PL for simplicity) spectrum from the first-layer before and after thermal treatment. Detailed growth condition, thermal treatment condition and the intensity change are summarized in Table 1. It can be clearly seen from Table 1, that all the samples in Table 1 show almost no change in PL intensity and that the second-layer of the present invention is quite effective in improving the thermal stability of the first-layer.

TABLE 1

|  |  | Fourth Embodiment | Fifth Embodiment | Sixth Embodiment |
|---|---|---|---|---|
| growth condition | pressure at growth of first and second-Layers | 1 atm | ½ atm | ⅛ atm |
|  | temperature at growth of first and second-layer | 825° C. | 785° C. | 725° C. |
|  | Al concentration of second-layer | 0.2 | 0.2 | 0.3 |
|  | thickness of second-layer | 300 Å | 300 Å | 210 Å |
| pressure of thermal treatment[1] | | 1 atm | 1 atm | ⅛ atm |
| change of PL intensity by thermal treatment[2] | | 0% | 11% | 0% |

[1]Thermal treatment condition: in 1:1 mixed gas of NH$_3$ and N$_2$ in volume.
[2]Decrease of PL intensity by thermal treatment

THIRD EXAMPLE TO COMPARE

A sample was prepared in the same way as Fourth Embodiment except that after the growth of InGaN first-layer, the supply of TEG and TMI was stopped and then 15 Å thick GaN was grown at 1100° C. There was no peak from InGaN first-layer in PL spectrum of this sample, indicating that the first-layer was deteriorated after the growth of the first-layer.

While the invention has been described in detail, the foregoing description is in all aspects illustrative and not restrictive. It is understood that numerous other modifications and variations can be devised without departing from the scope of the invention.

What is claimed is:

1. A method of manufacturing a Group III-V compound semiconductor in which a third-layer, which is formed by a Group III-V compound semiconductor which is expressed by a general formula Ga$_{x''}$Al$_{y''}$N (x"+y"=1, 0<x"≦1, 0≦y"<1), is grown at a temperature exceeding 1,000° C., after growing a first-layer, which is formed by a Group III-V compound semiconductor which is expressed by the general formula In$_x$Ga$_y$Al$_z$N (x+y+z=1, 0<x<1, 0<y<1, 0≦z<1), the method being characterized in that a second-layer, which is formed by a Group III-V compound semiconductor which is expressed by the general formula Ga$_{x'}$Al$_{y'}$N (x'+y'=1, 0<x'≦1, 0≦y'<1), is grown at 1,000° C. or a lower temperature, after growing the first-layer but before growing the third-layer.

\* \* \* \* \*